United States Patent
Clements et al.

(10) Patent No.: US 9,371,581 B2
(45) Date of Patent: Jun. 21, 2016

(54) APPARATUS FOR TREATING A GAS STREAM

(75) Inventors: Christopher James Philip Clements, Burnham on Sea (GB); Sergey Alexandrovich Voronin, Rensselaer, NY (US); John Leslie Bidder, Bristol (GB); Joanne Walsh, legal representative, Kingswood (GB); Daniel Martin McGrath, Bristol (GB)

(73) Assignee: Edwards Limited, Crawley, West Sussex (GB)

( * ) Notice: Subject to any disclaimer, the term of this patent is extended or adjusted under 35 U.S.C. 154(b) by 164 days.

(21) Appl. No.: 14/239,015

(22) PCT Filed: Jul. 11, 2012

(86) PCT No.: PCT/GB2012/051632
§ 371 (c)(1),
(2), (4) Date: Jul. 25, 2014

(87) PCT Pub. No.: WO2013/024249
PCT Pub. Date: Feb. 21, 2013

(65) Prior Publication Data
US 2015/0027369 A1     Jan. 29, 2015

(30) Foreign Application Priority Data

Aug. 17, 2011   (GB) .................................. 1114174.4

(51) Int. Cl.
*C23C 16/44*     (2006.01)
*B01D 53/32*     (2006.01)
(Continued)

(52) U.S. Cl.
CPC .......... *C23C 16/4407* (2013.01); *B01D 53/323* (2013.01); *B03C 3/743* (2013.01);
(Continued)

(58) Field of Classification Search
CPC .... C23C 16/4407; C23C 16/50; C23C 16/52; B01D 53/323; B01D 2257/553; B01D 2258/0216; B01D 2259/818; B03C 3/743; B08B 1/008; H05H 1/34; H05H 2245/1215; C01B 31/02; B01J 19/08; B82Y 30/00; B82Y 40/00
See application file for complete search history.

(56) References Cited

U.S. PATENT DOCUMENTS 5,091,625 A    2/1992   Kohda et al.
6,855,190 B1 *   2/2005   Nikkhah ........................... 96/51
(Continued)

FOREIGN PATENT DOCUMENTS

CN    102136410 A    7/2011
JP     H0352777 A    3/1991
(Continued)

OTHER PUBLICATIONS

Prosecution history of corresponding Chinese Application No. 201280040000.3 including: First Office Action dated Feb. 2, 2015 and Chinese Search Report dated Jan. 21, 2015.
(Continued)

*Primary Examiner* — Xiuyu Tai
(74) *Attorney, Agent, or Firm* — Westman, Champlin & Koehler, P.A.; Theodore M. Magee

(57) ABSTRACT

In an apparatus for treating a gas stream, a plasma generator comprises an electrode for energizing a source gas to generate a plasma flare by application of a high voltage. An inlet allows the gas stream into the apparatus and directs it into the generated plasma. A scraper is fitted for reciprocating movement from a first position to a second position for scraping a surface to remove solid deposits accumulated on the surface.

13 Claims, 7 Drawing Sheets

(51) Int. Cl.
*B08B 1/00* (2006.01)
*B03C 3/74* (2006.01)
*H05H 1/34* (2006.01)
*C23C 16/50* (2006.01)
*C23C 16/52* (2006.01)

(52) U.S. Cl.
CPC ............... *B08B 1/008* (2013.01); *C23C 16/50* (2013.01); *C23C 16/52* (2013.01); *H05H 1/34* (2013.01); *B01D 2257/553* (2013.01); *B01D 2258/0216* (2013.01); *B01D 2259/818* (2013.01); *H05H 2245/1215* (2013.01)

(56) References Cited

U.S. PATENT DOCUMENTS

| | | | |
|---|---|---|---|
| 2003/0054299 | A1 | 3/2003 | Kawamura et al. |
| 2003/0175052 | A1* | 9/2003 | Adachi et al. ............... 399/265 |
| 2005/0226790 | A1 | 10/2005 | Park et al. |
| 2007/0148061 | A1 | 6/2007 | Lau et al. |
| 2009/0274592 | A1 | 11/2009 | Bergeron |
| 2010/0061908 | A1 | 3/2010 | Smith |
| 2012/0085636 | A1* | 4/2012 | Al-Saud et al. ............... 204/173 |

FOREIGN PATENT DOCUMENTS

| | | |
|---|---|---|
| JP | H1081150 A | 3/1998 |
| JP | 2003299942 A | 10/2003 |
| JP | 2007263554 A | 10/2007 |
| JP | 2008093442 A | 4/2008 |
| JP | 2011038666 A | 2/2011 |
| WO | 2004064983 A1 | 8/2004 |
| WO | 2009010792 A2 | 1/2009 |
| WO | 2009134663 A1 | 11/2009 |

OTHER PUBLICATIONS

PCT International Search Report dated Apr. 2, 2013 for corresponding Application No. PCT/GB2012/051632, filed Jul. 11, 2012.
PCT International Written Opinion dated Apr. 2, 2013 for corresponding Application No. PCT/GB2012/051632, filed Jul. 11, 2012.
British Search Report dated Nov. 25, 2011 for corresponding Application No. GB1114174.4.
Office Action and Response for corresponding Chinese Application No. 201280040000.3, Sep. 29, 2015.
Japan Office Action dated Mar. 7, 2016 for corresponding Japanese Application No. 2014-525484.
Office Action dated Apr. 21, 2016 and Search Report dated Apr. 15, 2016 for corresponding Taiwanese Application No. 101125911.

* cited by examiner

APPARATUS FOR TREATING A GAS STREAM

CROSS-REFERENCE TO RELATED APPLICATION

This Application is a Section 371 National Stage Application of International Application No. PCT/GB2012/051632, filed Jul. 11, 2012, which is incorporated by reference in its entirety and published as WO 2013/024249 A2 on Feb. 21, 2013 and which claims priority of British Application No. 1114174.4, filed Aug. 17, 2011.

BACKGROUND

The present invention relates to apparatus for treating a gas stream. The invention finds particular application in the treatment of a gas stream exhaust from a process chamber used in the semiconductor or flat panel display industry.

A primary step in the fabrication of semiconductor devices is the formation of a thin film on a semiconductor substrate by chemical reaction of vapour precursors. One known technique for depositing a thin film on a substrate is chemical vapour deposition (CVD), which is commonly plasma enhanced. In this technique, process gases are supplied to a process chamber housing the substrate and react to form a thin film over the surface of the substrate. Examples of gases supplied to the process chamber to form a thin film include, but are not restricted to: Silane and ammonia for the formation of a silicon nitride film; Silane, ammonia and nitrous oxide for the formation of a SiON film; TEOS and one of oxygen and ozone for the formation of a silicon oxide film; and Al(CH3)3 and water vapour for the formation of an aluminium oxide film.

Gases exhausted from a process chamber can be treated with high efficiency and at a relatively low cost using a plasma abatement device. In the plasma abatement process, the gas stream is caused to flow into a thermal atmospheric pressure plasma discharge, which is primarily a source of heat. The plasma causes dissociation of the gas stream into reactive species which can combine with oxygen or hydrogen to produce relatively stable by-products.

During the plasma abatement of gasses that produce solid by-products (for example, silica during silane or TEOS oxidation), blockage problems have been encountered in the reaction chamber located down stream of the plasma flare. The chamber typically consists of a pipe of dimensions which may for example be approximately 30 mm to 50 mm in diameter and 90-150 mm in length. The purpose of the reaction chambers is to contain the hot gasses in a restricted volume to allow abatement reactions to occur. However, the chamber may become blocked with for example silica particles adhering to its walls when abating silane, TEOS or organosilanes.

One way of avoiding the adhesion of particles to the walls of the chamber is to form a water weir over their surface. However, there are nevertheless "dry" areas of the plasma reactor between the electrode (anode) and the reaction chamber, and the electrode itself requires additional cleaning.

The discussion above is merely provided for general background information and is not intended to be used as an aid in determining the scope of the claimed subject matter. The claimed subject matter is not limited to implementations that solve any or all disadvantages noted in the background.

SUMMARY

The present invention provides apparatus for treating a gas stream, comprising a first inlet for conveying a source gas into the apparatus, at least one electrode for energising the source gas to generate a plasma, a second inlet for directing the gas stream into the generated plasma, and a scraper being fitted for movement from a first position to a second position for scraping a surface to remove solid deposits accumulated on the surface.

The Summary is provided to introduce a selection of concepts in a simplified form that are further described in the Detail Description. This Summary is not intended to identify key features or essential features of the claimed subject matter, nor is it intended to be used as an aid in determining the scope of the claimed subject matter.

BRIEF DESCRIPTION OF THE DRAWINGS

In order that the invention may be well understood, some embodiments thereof, which are given by way of example only, will now be described with reference to the accompanying drawings, in which.

DETAILED DESCRIPTION

Figure 1:
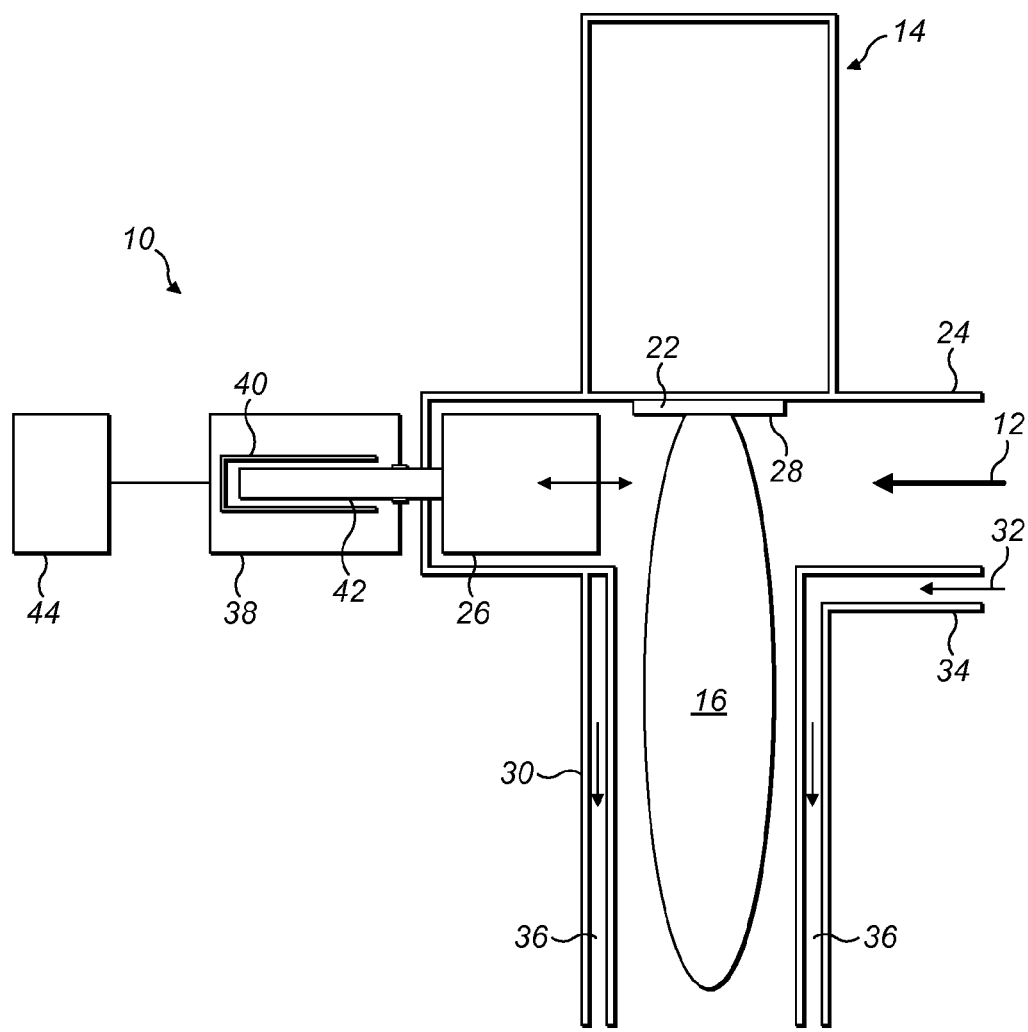
FIG. 1 shows schematically apparatus for treating a gas stream with a scraper of the apparatus in a first position.
Figure 2:
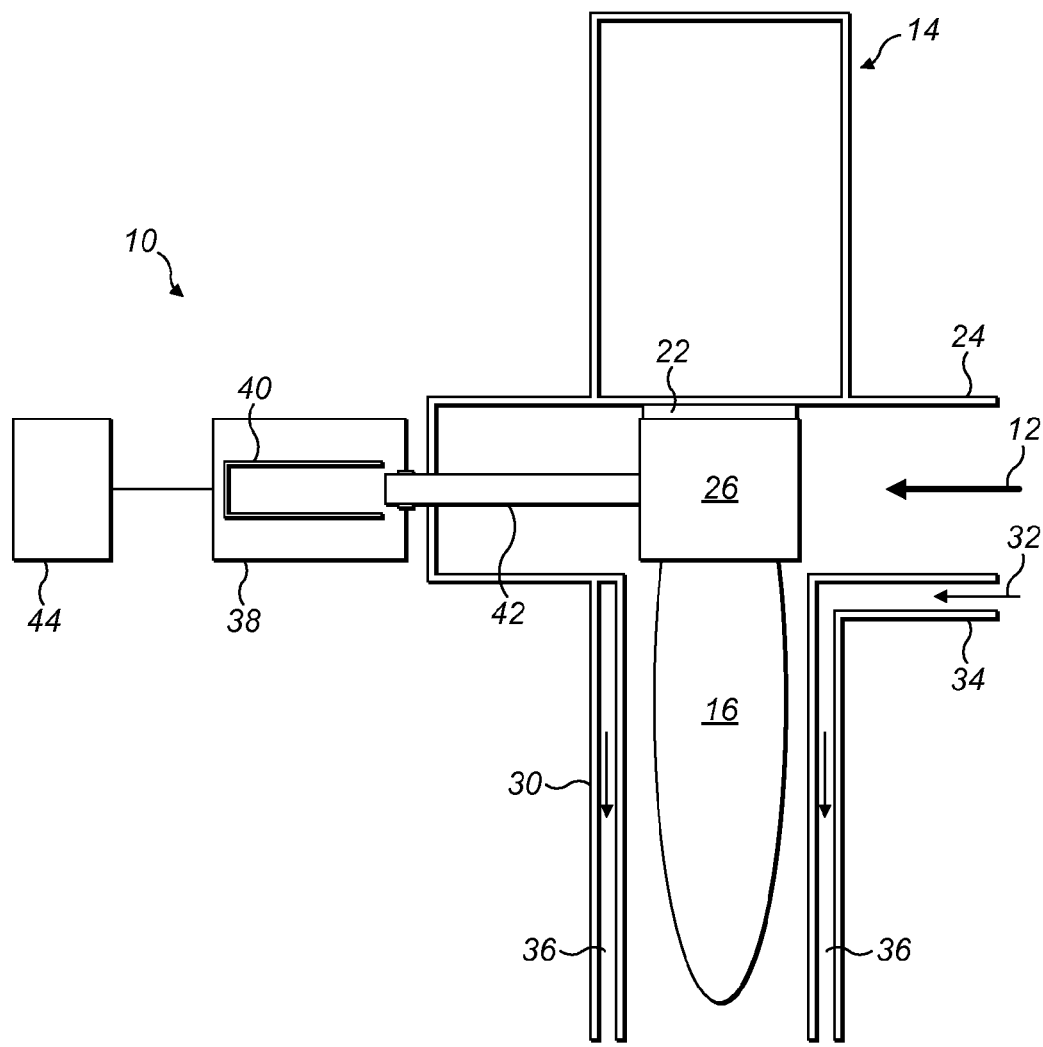
FIG. 2 shows schematically the apparatus with the scraper in a second position.

Referring to FIGS. 1 and 2, an apparatus 10 is shown for treating a gas stream 12. The apparatus comprises a plasma generator 14 for generating a plasma flare 16. The plasma generator is shown schematically in FIGS. 1 and 2. A more detailed description of the plasma generator is provided in relation to FIG. 7 below. The plasma generator comprises an electrode 22 for energising the source gas to generate the plasma by application of a high voltage. An inlet 24 allows the gas stream into the apparatus and directs it into the generated plasma. A scraper 26 is fitted for reciprocating movement from a first position withdrawn from the electrode as shown in FIG. 1 to a second position as shown in FIG. 2 for scraping a surface 28 of the electrode to remove solid deposits accumulated on the surface. In other embodiments of the invention described below, the scraper is arranged to scrape, alternative or additionally, other dry surfaces of the plasma generator or surfaces of the treatment apparatus downstream of the plasma generator.

The plasma generator comprises a second inlet (not shown) for conveying a source gas into the apparatus to be energised to form said plasma flare. The apparatus preferably comprises a reagent inlet (not shown) for conveying a reagent into the apparatus for improving treatment of the gas stream.

The apparatus comprises a reactor chamber 30 downstream of the electrode 22 in which the gas stream is treated. Since solid deposits may be generated when treating certain process gasses, for example silica particles when abating silane, TEOS or organosilanes, and the deposits may adhere to the walls of the chamber, a water weir is establishing over the walls. Water 32 enters the reaction chamber through a water inlet 34 and a water layer 36 is established over the walls of the chamber preventing particles from adhering and removing particles if they have adhered. Whilst most gas is treated in the reaction chamber, some treatment does occur upstream of the reactor chamber resulting in depositing on the surface 28 of the electrode 22.

The plasma generated in the apparatus is typically at a temperature of more than 1000° C. As will be described in more detail with reference to FIG. 7, the electrode comprises a nozzle, or opening, through which the plasma is conveyed towards the reactor chamber. Depositing in the region of the nozzle will be removed by the high temperature of the plasma. However, a relatively cooler region of the electrode, or plasma generator, surrounds the nozzle and is not typically exposed directly to the thermal plasma, particularly if the electrode is separately cooled. Deposits may therefore accumulate on the cooler region of the plasma generator, which inhibit proper functioning of the apparatus. The cooler regions cannot be subjected to water flushing without causing damage and therefore, the scraper 26 is arranged to scrape the deposits from the cooler, dry region of the plasma generator.

An actuator 38 actuates reciprocating movement of the scraper between first and second positions. In this example, the actuator is actuated by a fluid under pressure. The fluid may be liquid in which case it would be a hydraulic actuator or gas in which case it would be a pneumatic actuator. For convenience, a hydraulic actuator is referred to hereinafter, but it will be appreciated that this is interchangeable with a pneumatic actuator, depending for example on the force required to generated by the actuator.

The hydraulic actuator comprises a hydraulic cylinder 40 receiving a piston 42 connected to the scraper. However, other arrangements such as an electric motor could be used. A control 44, which for example may be a programmable logic control (PLC), is configured for selectively activating the actuator dependent on the accumulation of solid deposits on the surface of the electrode. For example, the control may cause scraping at predetermined intervals say every thirty seconds or every five minutes, depending on how quickly it has been ascertained that deposits accumulate on the electrode during treatment of a particular process gas. Alternatively, a probe (not shown) connected to the control may be provided for sensing the accumulation of deposits and the control activates the actuator when it is sensed that accumulation is above a selected amount.

In a modification, the scraper is configured so that the plasma flare is not interrupted when the scraper is in the second position for example by providing a bore in the scraper through which the flare may extend or by providing a generally C-shaped scraper so that the flare may extend through the space provided by the C-shape. These scraper configurations reduce the period of time during which the material of the scraper is directly exposed to the high temperature of the plasma. When in the second position the material of the scraper is not directly exposed to the plasma and is only exposed during transit between the first and second positions. Further, if the scraper were accidentally to become fixed in the second position, the plasma would still be conveyed into the reaction chamber and reduced damage would occur to the scraper.

Alternatively or preferably additionally, the scraper is configured so that when in the second position it does not significantly inhibit the flow of process gas into apparatus. In this regard, the scraper is preferably provided with means by which the process gas can be conveyed through or around the scraper when the scraper is in the second condition.

Figure 3:
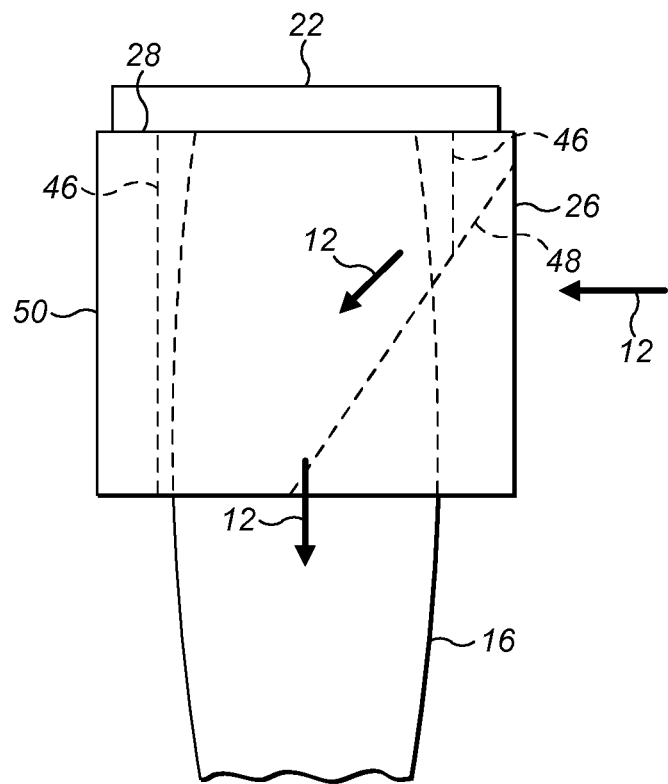
FIG. 3 shows a modified scraper in section.
Figure 4:
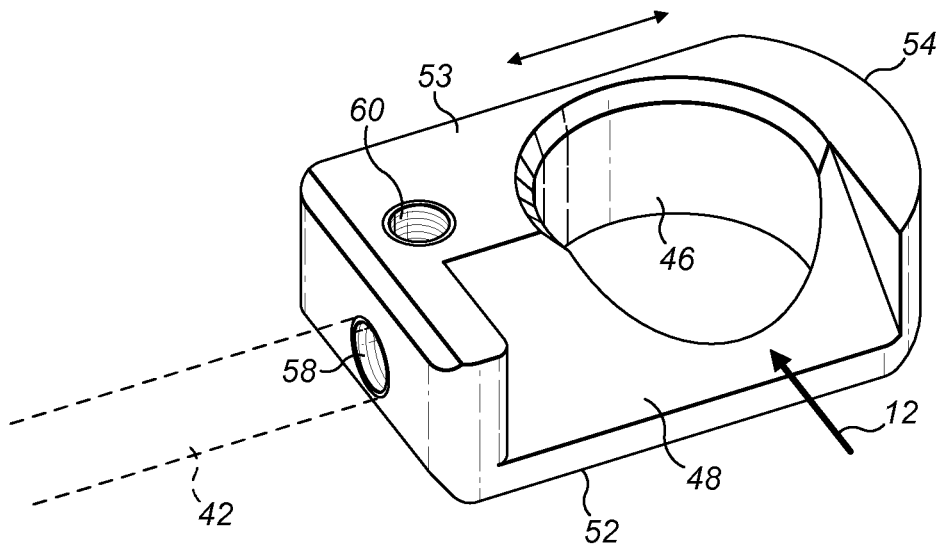
FIG. 4 shows the scraper of FIG. 3 in perspective.

FIGS. 3 and 4 show an example of scraper configured to allow continued flow of plasma and process gas when the scraper is in the second position. Prior to discussing FIGS. 3 and 4 in detail, it should be noted that in FIGS. 1 and 2, the process gas 12 is shown entering the apparatus in a direction which is generally parallel to the direction of reciprocating movement of the scraper. However, in a preferred and more typical arrangement the inlet for the process gas is arranged to convey process gas 12 into the apparatus in a direction which is generally perpendicular to the direction of reciprocating movement as shown in FIG. 4.

Referring now in more detail to FIGS. 3 and 4, the scraper 50 has a through bore 46 which in the second position of the scraper is aligned with the electrode 22 to allow the plasma flare 16 to extend through the bore. The scraper is shown in the second position in FIG. 3 and the through bore 46 is shown by broken lines. This configuration of the scraper allows continued generation of plasma even when the scraper is in the second position at least partially covering the electrode. It will be apparent to the skilled person that other configurations of the scraper, such as the previously mentioned C-shaped scraper, also allow continued generation of plasma.

The scraper is also shaped such that when in the second position the process gas stream is allowed to pass through the bore as shown by arrow 12. The scraper has a surface 48 (shown by broken lines in FIG. 3) angled relative to a flow direction of the gas stream for directing the gas stream though the bore 46. Accordingly, even when the scraper is in the second position, flow of the gas stream is not significantly restricted and therefore back pressure upstream of the abatement apparatus is not increased. This configuration is particularly useful in the event that the scraper becomes accidently fixed in the second position. Further, continued plasma treatment of the gas stream occurs when the scraper is in the second position.

The position of piston 42 is shown in broken lines in FIG. 4. The piston 42 engages with a tapered closed bore 58 and preferably has a further bore 60 for receiving a clamping screw for fixing the piston in position. It will be seen that the scraper 50 is arranged for reciprocating movement in the direction shown by the double headed arrow. In this case, the gas stream 12 flows into the apparatus in a direction generally perpendicular to the direction of reciprocating movement. During movement of the scraper from the first position to the second position, the surface 52 is generally parallel the surface 28 of the electrode 22. Preferably, the surface 52 is in contact with surface 28 during at least part of the movement. The opposite surface 53 is preferably in contact with the upper surface of the weir 64 during the last part of the movement. A leading edge 54, which may be curved as shown, scrapes the solid deposits from the electrode surface. The leading edge may be tapered to a sharp point or line to allow the scraper to more easily cut into the deposits which are firmly adhered to the plasma generator.

Figure 5:
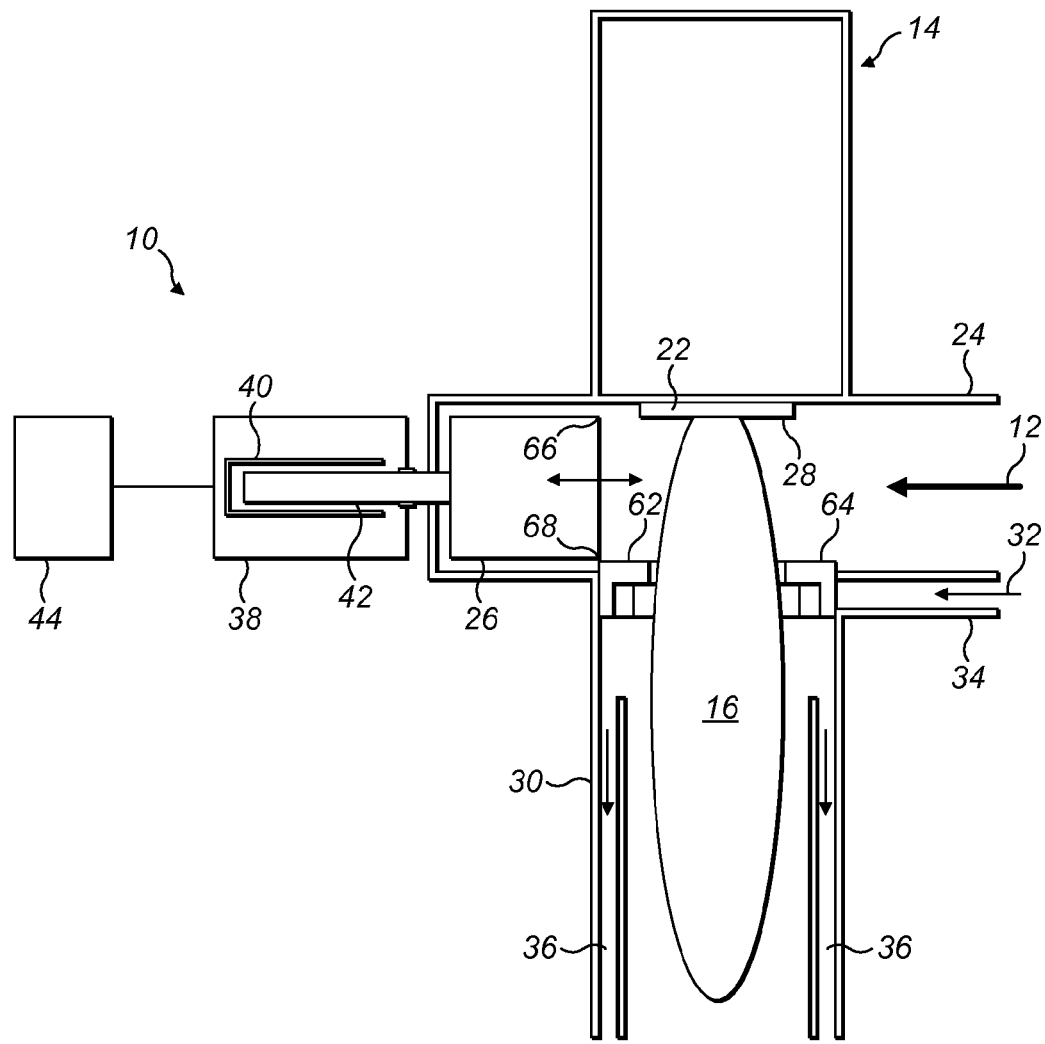
FIG. 5 shows schematically a modified apparatus for treating a gas stream with a scraper of the apparatus in a first position.

A modified treatment apparatus is shown in FIG. 5. In this apparatus, a weir guide 62 is shown for establishing the weir over the walls of the reactor chamber and separating the reaction chamber from the plasma generator to prevent splashing of water on the electrode. The weir guide is the subject of a separate patent application of the present applicant with the same priority date as the present application.

The upper surface 64 of the weir guide is dry and not flushed with water. Additionally, it is not in direct contact with the plasma flare 16. Accordingly, the surface is susceptible to the accumulation of deposits and therefore the scraper 26 in this apparatus is arranged to scrape the upper surface 64 during reciprocating movement between the first and the second positions. That is, a first, or upper, leading edge 66 of the scraper scrapes deposits from the electrode and a second, or lower, leading edge 68 of the scraper scrapes deposits from the upper surface 64 of the weir guide 62.

Figure 6:
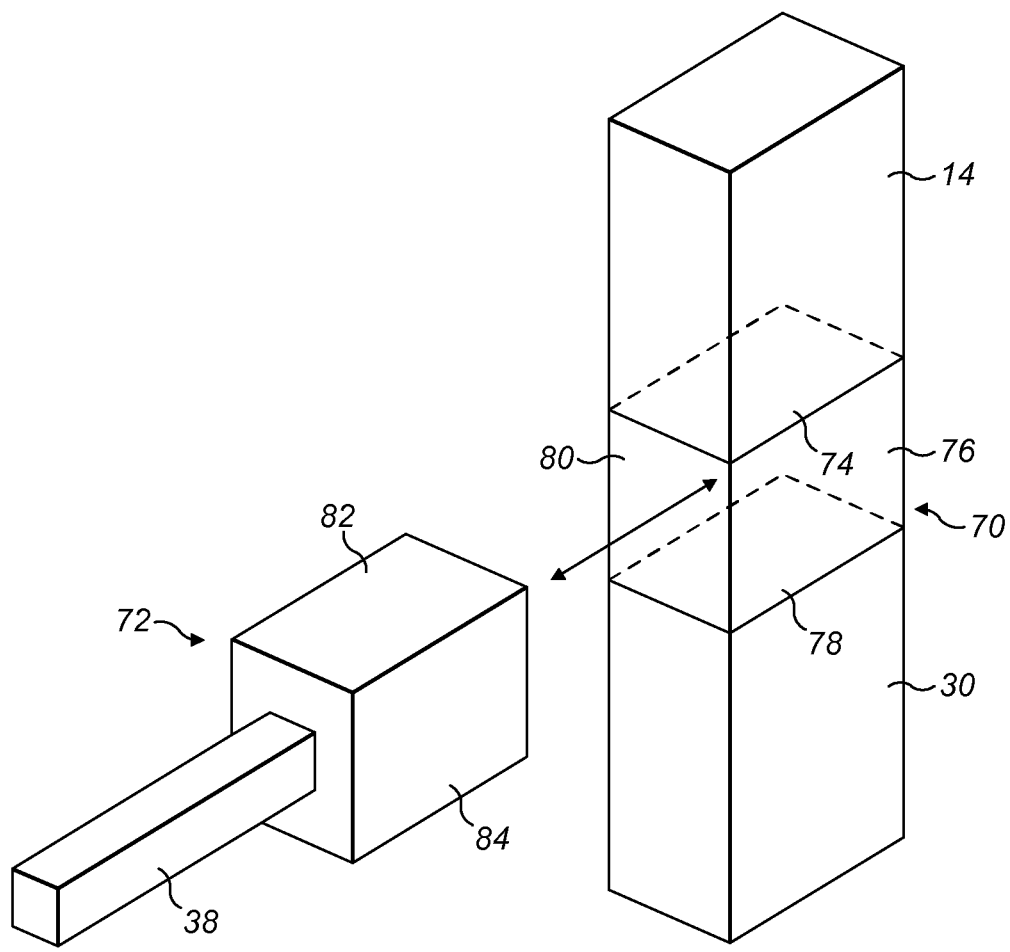
FIG. 6 shows schematically another embodiment of the present invention.

Another embodiment of the invention is shown schematically in FIG. 6. A region 70 is located between the plasma generator 14 and the reaction 30 and at least one surface which is susceptible to the accumulation of solid deposits. The scraper 72 is fitted for reciprocating movement (as shown by the double-headed arrow) from a first position withdrawn from the at least one surface to a second position for scraping the surface to remove accumulated solid deposits. In the example shown in this Figure there are four surfaces 74, 76, 78, 80 on which solid deposits may accumulate. The surface 74 may be a surface of an electrode of the plasma generator and the surface 78 may be a surface of a weir guide. Surfaces 76, 80 may form part of a housing of the treatment apparatus. The surfaces are typically not exposed directly to the plasma flare and are relatively cool. Further, washing with a liquid may cause damage or be impractical. The scraper as shown is configured for scraping a plurality of the surfaces and preferably all of the surfaces to remove deposits from the region 70. For example, surface 82 of the scraper is shaped to scrape surface 74 and surface 84 is shaped to scrape surface 76 and so on. Whilst scraper 72 as shown is generally rectilinear other shapes may be preferred to complement the different surfaces of the region 70.

Figure 7:
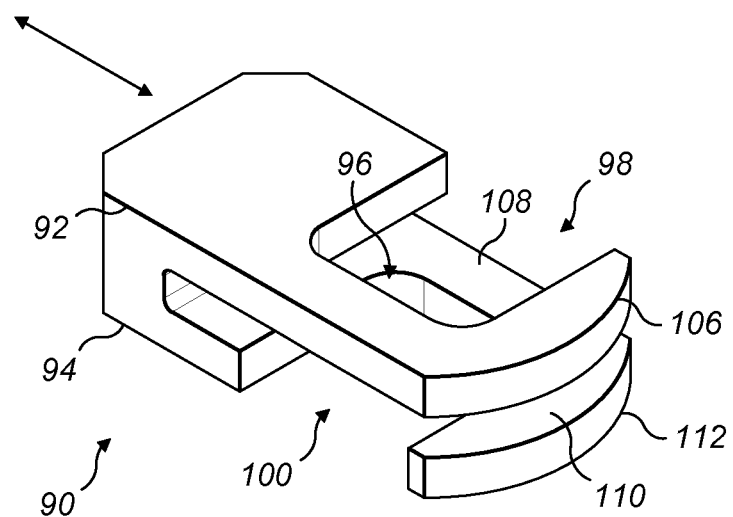
FIG. 7 shows two perspective views of another scraper.
Figure 7:
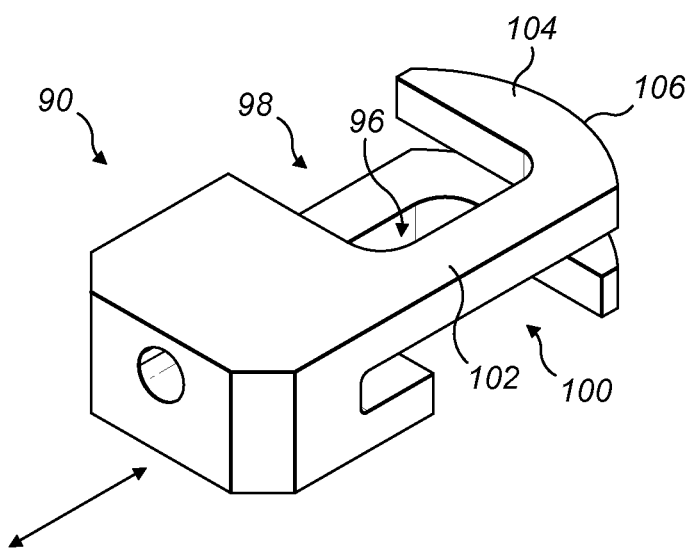

Another scraper 90 is shown in FIG. 7. The scraper 90 is shown from two perspectives in FIG. 7 and the double headed arrows show the directions of reciprocating movement when the scraper is incorporated in a treatment apparatus. The scraper comprises an upper section 92 and a lower section 94. The upper section has a right handed claw configuration and the lower section has a left handed claw configuration. The claws together provide a through bore 96 for the plasma flare when the scraper is in the second position. The upper claw provides an opening 98 which allows passage of a gas into the through bore 96, for example a gas stream for treatment. The lower claw provides an opening 100 which allows passage of another gas into the through bore 96, for example a purge gas for purging the apparatus. The upper claw has a first portion 102 which extends generally in the direction of travel and a second portion 104 which extends laterally to the direction of travel, the latter of which forms a leading edge 106 for scraping an electrode surface for example. The lower claw has a first portion 108 which extends generally in the direction of travel and a second portion 110 which extends laterally to the direction of travel, the latter of which forms a leading edge 112 for scraping a weir guide surface for example.

Figure 8:
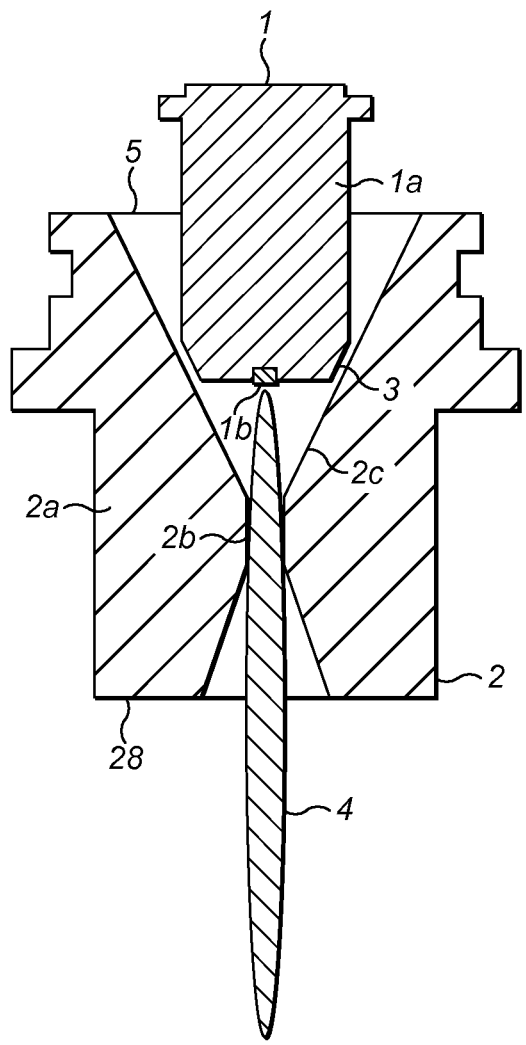
FIG. 8 shows in more detail a plasma generator of the treatment apparatus.

The plasma generator 14 may in one example be formed by the DC plasma torch shown in FIG. 8. The torch comprises a cathode arrangement 1 and an anode arrangement 2. The cathode arrangement comprises a substantially cylindrical body 1a and a button-type cathode 1b. The cooled (for example water-cooled) cathode body 1a is formed of a conducting metal with a higher thermal conductivity and work function than that of the thermionic material of the button cathode 1b, for example it is common to use a copper cathode body and a hafnium button cathode. The anode arrangement comprises a hollow body 2a, usually formed of copper, which further comprises an anode throat 2b and an inner frustro-conical surface portion 2c convergent towards, and terminating at, the throat 2b. When assembled the cathode arrangement 1 is located at least partially within and concentric to the copper anode 2. A gap must exist between the anode 2 and cathode 1 such that a conduit 3 is formed between the outer surface of the anode 2 and inner surface of the cathode assembly 1. The cathode 1 terminates within the conical portion 2c forming a plasma generating region 4 within said conical portion 2c. The scraped surface of the electrode of the plasma generator shown in FIG. 7 is surface 28.

The scrapers described herein are advantageously corrosion resistant in the presence of halogens like fluorine and have good mechanical strength. Additionally, the scrapers preferably have high thermal conductivity to minimise local heating (and consequently, destruction) during interaction with the plasma flare for short periods. The characteristics of nickel 201 alloy is a suitable material from which to make the scrapers having a thermal conductivity of 79.3 W/mC which is several times higher than stainless steel alloys for example. Nickel 201 is also resistant to corrosive gases which may be present in the apparatus and has good mechanical strength.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. An apparatus for treating a gas stream, comprising a plasma generator for generating a plasma flare for treating the gas stream in a reaction chamber downstream of the plasma generator, wherein the plasma flare extends into the reaction chamber and a region between the plasma generator and the reaction chamber comprises at least one surface which is susceptible to the accumulation of solid deposits and wherein a scraper is fitted for movement from a first position withdrawn from said at least one surface to a second position for scraping said at least one surface to remove accumulated solid deposits.

2. The apparatus as claimed in claim 1, wherein the scraper is configured for scraping a plurality of surfaces of said region for removing accumulated solid deposits.

3. The apparatus as claimed in claim 1, wherein the plasma generator comprises at least one electrode for energizing a source gas to generate the plasma flare, and the scraper is configured for scraping a surface of the electrode to remove solid deposits accumulated on the surface.

4. The apparatus as claimed in claim 1, comprising an actuator for actuating said movement of the scraper.

5. The apparatus as claimed in claim 4, comprising a control configured for selectively activating the actuator dependent on the accumulation of solid deposits on the surface.

6. The apparatus as claimed in claim 5, wherein the control is configured to activate the actuator at predetermined intervals during use of the apparatus.

7. The apparatus as claimed in claim 1, wherein the scraper has a through bore such that in the second position the plasma flare extends through the bore.

8. The apparatus as claimed in claim 7, wherein the scraper is shaped such that when in the second position the gas stream is allowed to pass through the bore.

9. The apparatus as claimed in claim 8, wherein the scraper has a surface angled relative to a flow direction of the gas stream for directing the gas stream though the bore.

10. The apparatus as claimed in claim 1, comprising a weir guide for establishing a liquid weir over an inner surface of the reactor chamber, the weir guide having a surface for separating the liquid weir from the electrode, and wherein movement of the scraper from the first position to the second position is arranged to scrape the surface of the weir guide.

11. The apparatus as claimed in claim 10, wherein an opening through the surface of the weir guide is generally aligned with a through bore of the scraper when it is in the second position.

12. The apparatus as claimed in claim 1, wherein the scraper is made from a material comprising Nickel.

13. A scraper configured for an apparatus for treating a gas stream, the apparatus comprising a plasma generator for generating a plasma for treating the gas stream in a reaction chamber downstream of the plasma generator wherein the plasma extends into the reaction chamber and a region between the plasma generator and the reaction chamber comprises at least one surface which is susceptible to the accumulation of solid deposits and wherein the scraper is fitted for movement from a first position withdrawn from said at least one surface to a second position for scraping said at least one surface to remove accumulated solid deposits.

* * * * *